United States Patent
Van Der Tempel et al.

(10) Patent No.: US 10,250,011 B2
(45) Date of Patent: Apr. 2, 2019

(54) DRIVER CIRCUITRY AND ELECTRONIC DEVICE INCLUDING A MULTIPURPOSE INDUCTOR

(71) Applicant: Sony Semiconductor Solutions Corporation, Atsugi-shi (JP)

(72) Inventors: Ward Van Der Tempel, Keerbergen (BE); Maarten Kuijk, Antwerpen (BE); Gobinath Jegannathan, Etterbeek (BE)

(73) Assignee: SONY SEMICONDUCTOR SOLUTIONS CORPORATION, Atsugi-shi (JP)

( * ) Notice: Subject to any disclaimer, the term of this patent is extended or adjusted under 35 U.S.C. 154(b) by 52 days.

(21) Appl. No.: 15/625,170

(22) Filed: Jun. 16, 2017

(65) Prior Publication Data

US 2017/0365979 A1  Dec. 21, 2017

(30) Foreign Application Priority Data

Jun. 20, 2016  (EP) .................................... 16175206

(51) Int. Cl.
*H02M 3/156* (2006.01)
*H01S 5/042* (2006.01)
(Continued)

(52) U.S. Cl.
CPC ............ *H01S 5/0428* (2013.01); *G01S 7/484* (2013.01); *G01S 7/4865* (2013.01); *G01S 17/10* (2013.01);
(Continued)

(58) Field of Classification Search
CPC . G01S 7/10; G01S 7/484; G01S 7/486; G01S 7/4865; G01S 17/10;
(Continued)

(56) References Cited

U.S. PATENT DOCUMENTS 7,804,256 B2    9/2010  Melanson
7,839,130 B2 *  11/2010 Shimizu ................... H02M 1/32
                                                323/282
(Continued)

FOREIGN PATENT DOCUMENTS

EP   1 513 202 A1   3/2005

OTHER PUBLICATIONS

Hyun-Chang Kim et al. "A Single-Inductor, Multiple-Channel Current-Balancing LED Driver for Display Backlight Applications," Energy Conversion Congress and Exposition (ECCE), 2013 IEEE, 10.1109/ECCE.2013.6647154, 2013, pp. 4.
(Continued)

*Primary Examiner* — Yemane Mehari
(74) *Attorney, Agent, or Firm* — Xsensus LLP (57) ABSTRACT

Driver circuitry including an inductor configured to be used both as an inductor of a buck converter and to provide high-speed pulse driving of a load. The driver circuitry includes the buck converter, which includes a first switch, a second switch and a comparator configured to drive the first switch and the second switch. The inductor is connected between the first switch and the second switch of the buck converter and the load and supplies current to drive the load.

14 Claims, 9 Drawing Sheets

(51) Int. Cl.

| | |
|---|---|
| *G01S 7/484* | (2006.01) |
| *G01S 7/486* | (2006.01) |
| *G01S 17/10* | (2006.01) |
| *H02M 1/08* | (2006.01) |
| *H02M 3/158* | (2006.01) |
| *G01S 17/36* | (2006.01) |
| *G01S 17/89* | (2006.01) |
| *H02M 1/00* | (2006.01) |
| *H05B 37/02* | (2006.01) |

(52) U.S. Cl.
CPC .............. *G01S 17/36* (2013.01); *G01S 17/89* (2013.01); *H02M 1/08* (2013.01); *H02M 3/158* (2013.01); *G01S 17/102* (2013.01); *H01S 5/0427* (2013.01); *H02M 2001/0009* (2013.01); *H02M 2001/0025* (2013.01); *H05B 37/0281* (2013.01)

(58) Field of Classification Search
CPC .. H02M 3/156–3/158; H02M 2001/00; H02M 2001/0009; H02M 2001/0025; H02M 1/00; H02M 1/08; H05B 37/02; H05B 37/0281; H01S 5/042; H01S 5/0428
USPC ........ 323/222–229, 232, 233; 315/200, 201; 307/130
See application file for complete search history.

(56) References Cited

U.S. PATENT DOCUMENTS

| | | |
|---|---|---|
| 9,185,762 B2 | 11/2015 | Mark et al. |
| 9,282,604 B2 | 3/2016 | Lai et al. |
| 9,288,855 B2 | 3/2016 | Fan |
| 9,288,867 B2 | 3/2016 | Hsia et al. |
| 9,312,776 B2* | 4/2016 | Freeman .................. H02M 1/08 |
| 9,774,251 B2* | 9/2017 | Kobayashi ............ H02M 3/156 |
| 2006/0176035 A1* | 8/2006 | Flatness ................. H02M 3/156 323/282 |
| 2010/0245802 A1* | 9/2010 | Madhani ............... G01S 7/4814 356/5.05 |
| 2013/0301909 A1* | 11/2013 | Sato ....................... G01B 11/25 382/154 |
| 2014/0091724 A1* | 4/2014 | Palmer ................ H02M 3/1582 315/201 |
| 2014/0104592 A1 | 4/2014 | Tien et al. |
| 2017/0025961 A1* | 1/2017 | Seeman .................. H02M 1/08 |

OTHER PUBLICATIONS

Albert T. L. Lee et al., "Scalability of Quasi-Hysteretic FSM-Based Digitally Controlled Single-Inductor Dual-String Buck LED Driver to Multiple Strings," IEEE Transactions on Power Electronics, vol. 29, No. 1, Jan. 2014, pp. 13.

* cited by examiner

DRIVER CIRCUITRY AND ELECTRONIC DEVICE INCLUDING A MULTIPURPOSE INDUCTOR

TECHNICAL FIELD

The present disclosure relates to an electronic driver circuitry for a load, especially for light sources of which light emitting diodes (LED) or OLED's or lasers or laser diodes are examples. In particular, the present disclosure relates to a driver circuitry for an illumination device for a range finding device, a time of flight camera, or a time of flight sensor as well as to an illumination device for such device or camera as well as to the device or camera itself.

TECHNICAL BACKGROUND

Driver circuits are known that are inverting, or that consist of a combination of buck and boost converters with typically four switches. Such existing buck-boost systems are, however, not efficient, e.g. because they have to be complemented with a pulsating laser driver, which is not an easy task.

Although there exist techniques for driver circuits, it is generally desirable to provide a more efficient driver circuitry for driving a load.

SUMMARY

According to a first aspect the disclosure provides a driver circuitry including an inductor configured to be used both as inductor of a buck convertor, and to provide high-speed pulse driving of a load.

Further aspects are set forth in the dependent claims, the following description and the drawings.

BRIEF DESCRIPTION OF THE DRAWINGS

Embodiments are explained by way of example with respect to the accompanying drawings, in which.

DETAILED DESCRIPTION OF EMBODIMENTS

Below, embodiments of a driver circuitry are disclosed, the driver circuitry comprising an inductor configured to be used both as inductor of a buck convertor, and to provide high-speed pulse driving of a load.

From one side the inductor may thus work as a switching supply that is operated in a way that an average current is provided, whereas from the other side, a load such as a laser may tap off power from the inductor. For example, for time-of-flight applications, one can envision a system whereby the laser generates a 50% duty-cycle pulse train, like a clocking circuit. Other data formats can also be targeted, like gold-codes, pseudo random or even sparse pulsed signals and data patterns including 8B/10B.

According to a specific embodiment, the driver circuitry is configured to be used to drive a light source, e.g. a laser, for (short) distance range-finding with a pulse frequency of several MHz; of e.g. 20 MHz, substantially 20 MHz, 100 MHz or substantially 100 MHz.

The inductor of the driver circuitry may be a single inductor conversion circuit. A single inductor that is applied in the driver circuitry can have a small inductance, and can hence have a small volume, and a small parasitic resistance. A small volume may facilitate the inclusion of the circuit into smart-phones in an electromagnetic compatible way. The cost of a small inductor is also much lower than that of a larger inductor. The inductor can be as low as 100 nH.

Further, according to some embodiments, in burst mode operation, it is possible to quickly start and stop a burst. In that way, very strong, short bursts of light can be generated for a low average power dissipation, the strong light burst improving the background light rejection considerably. The time constants related with the full burst operation may be such that a subsequent burst can be given quite soon after a previous one in a way that there is no memory effect in the system, which may increase system measurement accuracy. This may result in that each burst operates in a same predictable way.

Still further, according to some embodiments the system may have elements of a switched supply, and can as such be very efficient with respect to power conversion from battery to laser. By using a single inductor for both the switching supply as for the modulation of the laser, only the parasitic resistance of the one inductor is added to the power loss. A driver circuitry that is based on a single inductor has half of the loss as compared to a driver circuitry that uses two inductors due to the parasitic resistance of each inductor. Embodiments that operate with a single inductor in a predictable way thus reduce the level of power-loss.

According to some embodiments, a current in the load is to be supplied by the single inductor. I.e. the driver circuitry does not require an additional storage capacitor which supplies current to the load.

Consequently, according to some embodiments, the driver circuitry does not require a large capacitor in the circuit. In particular, the driver circuitry may be designed to not have capacitors that exceed 100 nF.

In particular, the driver circuitry may be arranged to work for a power supply (e.g. a battery) with a voltage range that has an overlap with the voltage over a load voltage range (e.g. laser voltage range) in its ON-state. With a battery voltage e.g. of between 2.4V and 4.7V, a laser can for example be driven that has ON-state supply range between 2.0V to 4.0V. Battery supply voltage can be depending on its (dis-)charging state. The voltage level of the laser diode can depend on the used type of laser, its output wavelength, its temperature, its age etc. A battery voltage of 2.4V can thus drive the load's ON-state supply at 4.0V. A battery voltage of 4.7V can also drive the ON-state supply at 2.0V. In this way effectively stepping up and stepping down towards the load's ON-state supply can be achieved with the same circuit. With classical switched power supply systems, such a voltage overlap would result in a converter that needs to achieve both buck-mode and boost-mode which requires a complex system with more places where power loss will be present due to subsequent parasitic resistors.

The driver circuitry may include a buck convertor that includes, in addition to the inductor, a first switch, a second switch, and a diode for switched operation, and a comparator configured to drive the first switch and the second switch. These switches may be transistors, e.g. PMOS or NMOS transistors.

The driver circuitry may further include a driving switch connected to the inductor to which an input is applied that is the inverse of a target light pattern output.

To get a light pattern output, the inverse of the wanted pattern can be applied on input pulse1 of the driving switch. When that signal is HIGH, the current originating from the right side of the inductor will flow through the driving switch, instead of through load, in that way avoiding e.g. light generation by a laser. When the signal pulse1 applied to driving is LOW, then current will flow through load, in that way e.g. generating light in a laser.

The driver circuitry may further include a comparator configured to compare a voltage Vsense that is indicative for the current in the inductor with a reference voltage Vref.

The driver circuitry may further include a sensing resistor configured to measure the current in the inductor L1. A voltage drop Vsense at this resistor may be proportional with the current in the inductor according to Ohm's law.

The driver circuitry may include a charging capacitor configured to function as a charge tank. This charging capacitor may be located close to the switches of the laser driver. A 100 nF charging capacitor can suffice. This may lower volume and cost. A small parasitic resistance may increase the power conversion efficiency. When the battery connection is very close, the charging capacitor C1 can be omitted.

The load that is driven by the driver circuitry may be a light source, e.g. a light-emitting diode (LED), an organic light-emitting diode (OLED), or a laser or a laser diode. In particular, the driver circuitry may be used in an illumination device for a range finding device, a time of flight camera, or a time of flight sensor as well as an illumination device for such device or camera as well as the device or camera itself.

The driver circuitry may for example be used in any electronic device including, embedding or being associated or connected to a range finding device with an illumination unit. More advantageously, the range finding device with the illumination unit associated to the driver circuitry may be a Time-of-Flight camera system, and the electronic device may be, but is not limited to, any of a mobile or standalone device or platform such as a computer system, a laptop, a tablet, a smartphone, a virtual or augmented reality head's up display system, a smartwatch, a photo camera, a video camera, a drone, etc.

The driver circuitry may be used in time-of-flight applications featuring a high efficiency of energy-conversion and a high precision of distance-measurements based on a single inductor conversion circuit.

Embodiments are now explained by way of example with respect to the accompanying drawings.

Figure 1:
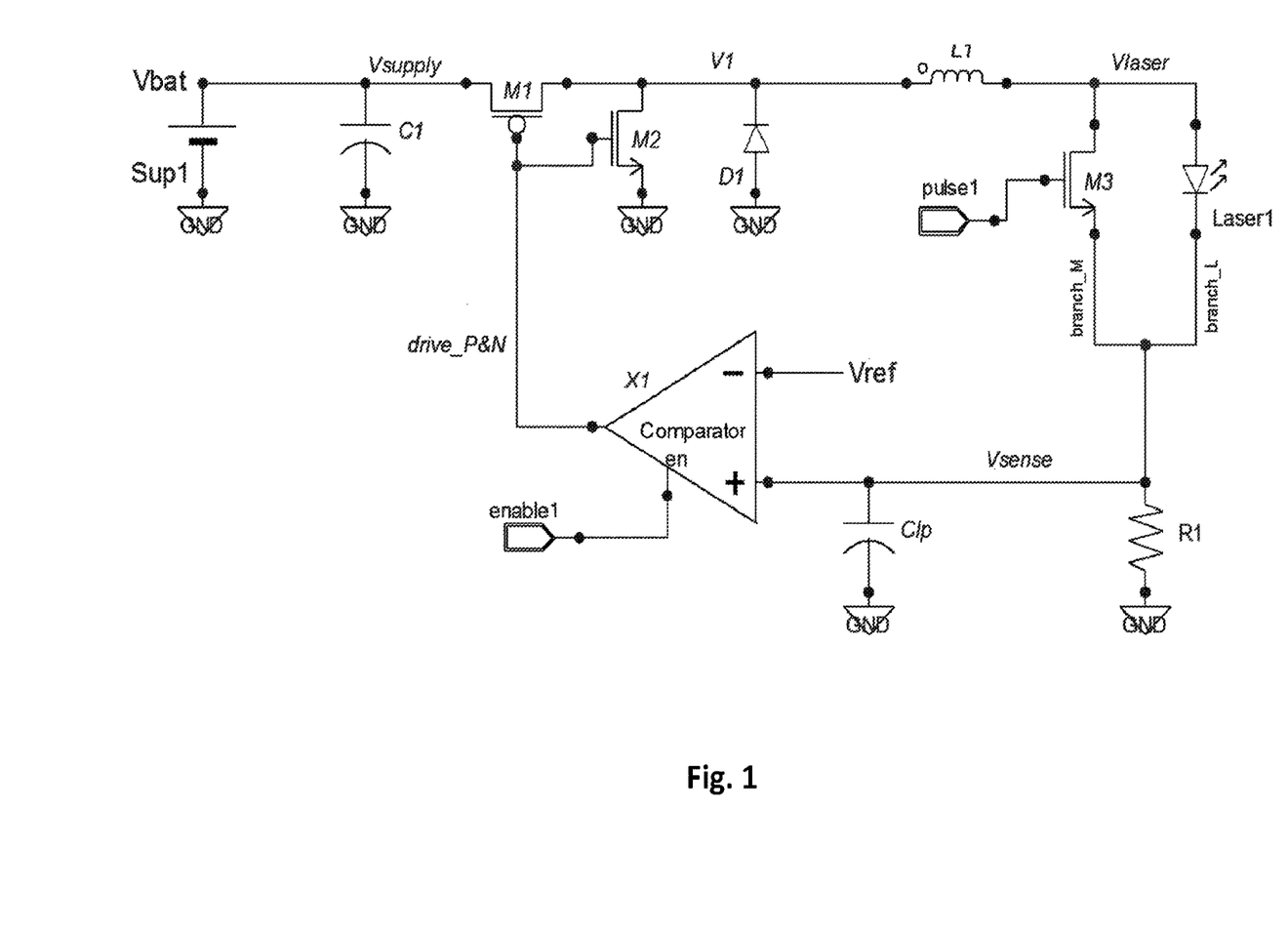
FIG. 1 shows a schematic representation of a driver circuitry according to an embodiment.

FIG. 1 shows a schematic representation of a driver circuitry according to an embodiment of the present disclosure. A battery Sup1 is delivering the voltage for operation of the driver circuit. In alternative embodiments, the driver circuitry may operate from different supplies, e.g. one that is provided over USB, or a voltage regulator. Battery Sup1 provides a voltage Vbat that is brought to the driver circuitry over PCB traces, where it becomes Vsupply. The latter voltage can be different, due to the non-ideal transport of the supply over e.g. printed circuit board traces. Charging capacitor C1 is therefor provided to be located close to the laser driver, as a charge tank. When the battery connection is really close, charging capacitor C1 can be omitted.

The driver circuitry further includes a single inductor L1. This single inductor L1 plays a dual role. The current stabilizing effect of the inductor L1 is used in two ways: from the left side it is used like in a classical buck convertor, and from the right side it is used to get high-speed laser pulse driving.

The driver circuitry includes a buck convertor that operates from the left side, whereby switches M1, M2 and diode D1 provide switched operation. Comparator X1 drives the switches M1 and M2. Signal drive_P&N from comparator X1 is driving both switches M1 and M2. When M1 is closed, the inductor L1 charges with current coming from the supply Sup1 (and from C1). Current through inductor L1 increases, until a threshold is reached, measured by the comparator. At that moment, M1 is opened, and the inductor current remains flowing, but now diode D1 becomes biased forwardly. A second switch, M2 is closed simultaneously, or just a little bit later, to pull the voltage M1, at the left of inductor L1 to GND. The switch M2 is added in order not to lose the power that is generated in the diode D1. So M2 will close, very soon after M1 has been opened. According to this embodiment, diode D1 is present as a back-up for any short period that both switches M1 and M2 are open. Switches M1 and M2 can be driven in a so-called non-overlapping way. In alternative embodiments, the buck convertor works with merely a diode D1, but no switch M2. The generation of timed signals for switches M1 and M2 according to the description above can be realized by a skilled person. By means of the enable signal enable1 that is fed to comparator X1 of the driver circuitry the charging of inductor L1 can be started and stopped. The person skilled in the art can drive the outputs of the comparator when not being enabled, such that M2 remains closed and M1 remains open. The current in the loop and though inductor L1 then decreases until zero within a short time period.

Whilst from the left side, the switching supply is operated in a way that an average current is provided, at the right side, the laser Laser1 is tapping off power from the inductor L1. For time-of-flight applications, one can envision a system whereby the laser generates a 50% duty-cycle pulse train, like a clocking circuit. Other data formats can also be targeted, like gold-codes, pseudo random or even sparse pulsed signals and data patterns. For distance range-finding, at least one predetermined pulse frequency is to be considered. For example, a range-finding pulse frequency of 100 MHz is considered a preferred frequency for accurate short distance measurement with respect to the Time-of-Flight principle.

To get a light pattern output, the inverse of the wanted pattern can be applied on input pulse1 of switch M3. When that signal is HIGH, the current originating from the right side of the inductor L1 will flow through the switch M3, instead of through Laser1, in that way avoiding light generation by Laser1. When the signal pulse1 applied to M3 is LOW, then current will flow through Laser1, in that way generating light in Larer1.

The current in the inductor can be measured by resistor R1, since it is in series with the inductor. The voltage will be proportional with the current according to ohm's law. A reference voltage Vref can be compared with the voltage Vsense on the R1. This comparison determines whether at the left side, current has to be increased though inductor L1 by closing switch M1 again.

Other systems to drive M1 and M2 are also possible. For example, an oscillator with a known frequency can be used that generates a clocking system, with a variable duty-cycle.

The sensing resistor R1 can be placed on many positions, like in branch_M, banch_L, or on positions left and right of inductor L1. The resistor value of sensing resistor R1 can be chosen by a trade-off between measurement accuracy and power conversion efficiency. A large resistor gives for a given current a large voltage that makes it easy for comparator X1 to compare with Vref. However, the power dissipation in that resistor is lost. Capacitor Clp can help to filter the incoming signal to the comparator. On the other hand, a small resistor R1, gives a smaller voltage, less power dissipation, but it demands a more precise comparator X1.

Figure 2:
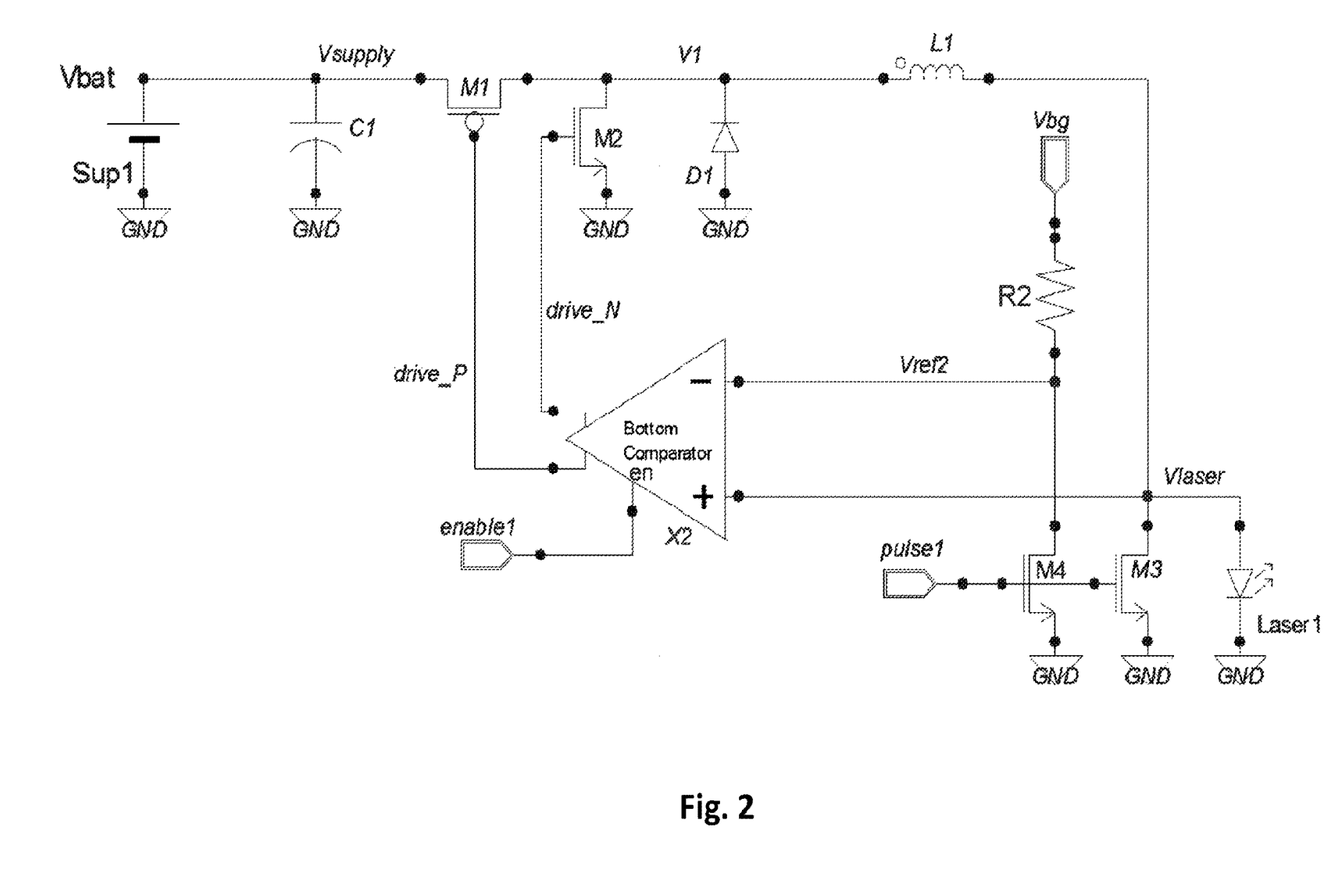
FIG. 2 shows a schematic representation of a driver circuitry according to an embodiment, whereby the parasitic resistance of the driving switch M3 is used in the regulation of the switched supply.

FIG. 2 shows a schematic representation of a driver circuitry according to a further embodiment, whereby the parasitic resistance of the driving switch M3 is used in the regulation of the switched supply.

The driver circuitry of this embodiment features separately driven switches M1 and M2 with non-overlapping signals, and an alternative for the comparison of the currents. Signal drive_P is driving switch M1, and signal drive_N drives switch M2. The generation of timed signals for switches M1 and M2 is known to the skilled person.

In this embodiment there is no sensing resistor R1. This avoids the power loss through that resistor. In fact, the switch M3 that short-circuits the laser Laser1, is not perfect and will always have some residual resistance in the closed state. Depending on the current through M3 one will have a larger or smaller voltage in the closed state. A replica transistor/switch M4 is provided that is Krep times smaller (Krep being 20 to 1000, by providing a smaller W/L) and that is driven by the same signal pulse1. At its drain is a resistor R2 that gets a known voltage Vbg, e.g. originating from a bandgap circuit. The voltage Vbg and the resistor R2 will determine largely the current through the switch M4, when it is closed. If the switch is in the same technology, and made as replica of M3, at the same temperature, the voltages Vlaser and Vref2 will be equal when the current through the laser is Krep times larger. The comparator X2 compares only when the voltage is low, i.e. when M3 and M4 are closed (conductive).

In alternative embodiments, instead of working with a voltage Vbg and a resistor R2, one can make a current from a bandgap reference, and provide that as a current source to the drain of switch M4 (principle not shown in drawings).

During operation, the average voltage on the node Vlaser, i.e. the average voltage that is seen by the inductor L1, at its right side, is lower than the applied supply voltage Vsupply. If for example, the pulse1 is HIGH and LOW for about 50%, the laser will, during a burst, also be ON 50% of the time. If the voltage of the laser is 4V when ON, and 0V when OFF, then the supply voltage Vsupply should be at least 2V (in ideal circumstances), in reality however, rather at least 2.5V for taking some losses. Vsupply can further be much higher (e.g. 6-7V), as long as the switches M1 and M2 and their driving circuits take care of these elevated voltage levels.

Operation of a driver circuitry according to the embodiment of FIG. 2 is described below by means of simulation results. The simulation results are based on the exemplifying set of components values that is given in following table:

| Component/Variable | Possible Value |
| --- | --- |
| L1 | 320 nH with 30 mΩ parasitic R in series |
| C1 | 100 nF |
| M1 | PMOS M = 9000 W = 6 u L = 0.35 u |
| M2 | NMOS M = 4500 W = 6 u L = 0.35 u |
| M3 | NMOS M = 6400 W = 3 u L = 0.35 u |
| M4 | NMOS M = 8 W = 3 u L = 0.35 u |
| Vsupply | 3.3 V |
| Period of illumination | 1 us |
| Pulsation frequency | 100 MHz |
| Average Current through Laser | 0.5 A |
| Laser Voltage @ 1 A | 2.4 V |
| R2 | 2200 W |
| Vbg | 3.3 V |

A CMOS technology with 350 nm transistors was used in this example. According to this embodiment, external components are C1, L1 and the laser. All the rest is integrated on a single chip.

Figure 3:
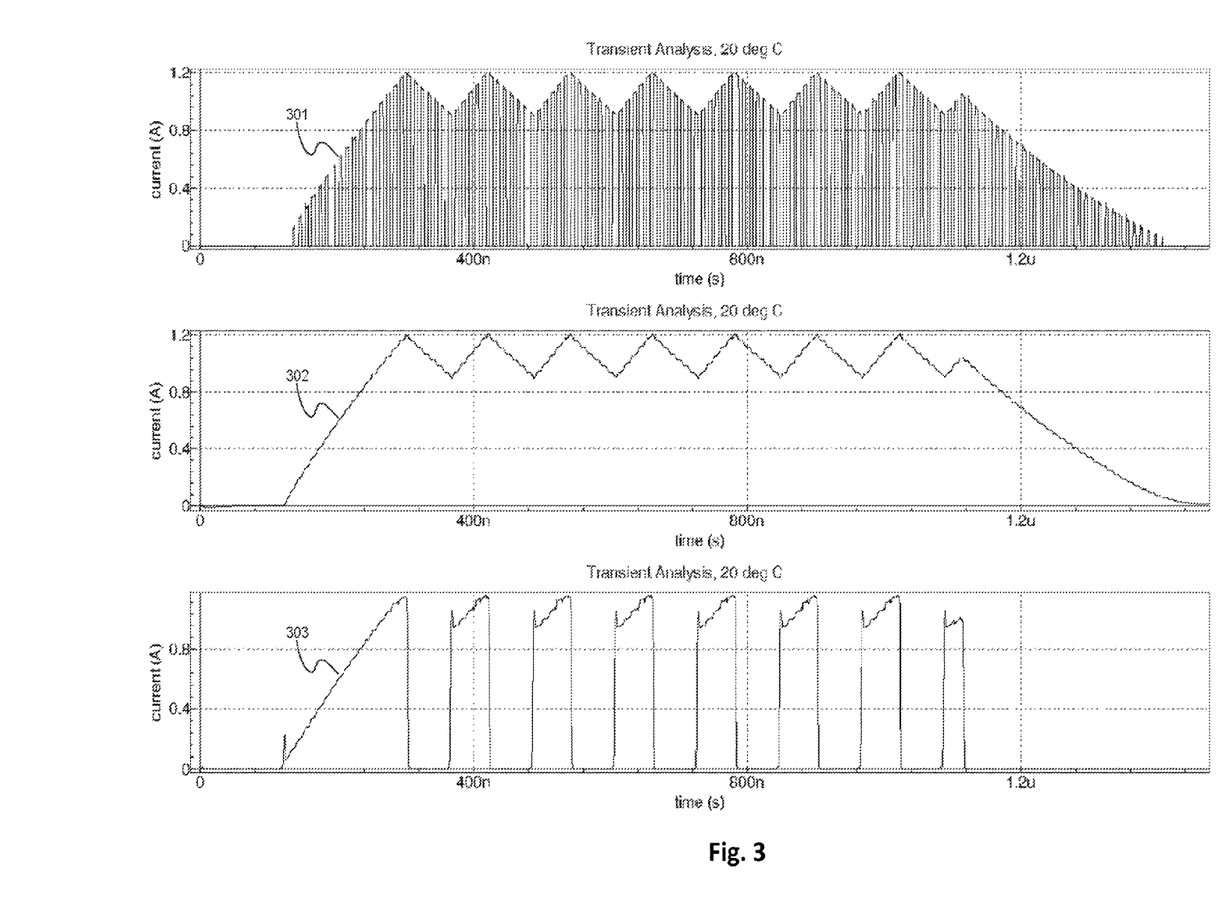
FIG. 3 shows simulated currents versus time of a circuit according to FIG. 2.

FIG. 3 shows simulated currents versus time of a circuit according to FIG. 2. Curve 301 is the current through the laser being a burst of 100 MHz, during about 1 microsecond. Curve 302 is the inductor current, and curve 303 is the current delivered by the supply (originating from Sup1 and C1). The comparator X2 drives the switches M1 and M2, at a rate of about 10 MHz, with a duty cycle of about 50%, pumping energy in the inductor L1. When this pumping happens, the current in the inductor L1 increases, to about 1.2 A, after which M1 is opened, and M2 gets closed. Then the current decreases to about 900 mA. The enable signal enable1 (not shown), is turned HIGH at 100 ns, and 1 microsecond later it is turned LOW again. The inductor L1 then stops getting charged (at 1.1 us), but M3 and M4 remain being modulated, as can be seen in the current 301, the remainder of the energy in the inductor L1 still being used for bursting the output of the laser until full extinction (@1.4 us). The current 302 through L1 goes back to zero.

The current burst 301 shows a modulation in amplitude of about 20%, i.e. not all the 5 ns pulses have the same amplitude, the amplitude is zig-zagging at the frequency of the overall charging and discharging of the inductor by the buck regulation system. This is not a problem for the precision of the time of flight measurement, as long as it is made enough repeatable. With the driver circuitry proposed here, that is perfectly the case, since there a no long time constants involved.

Figure 4:
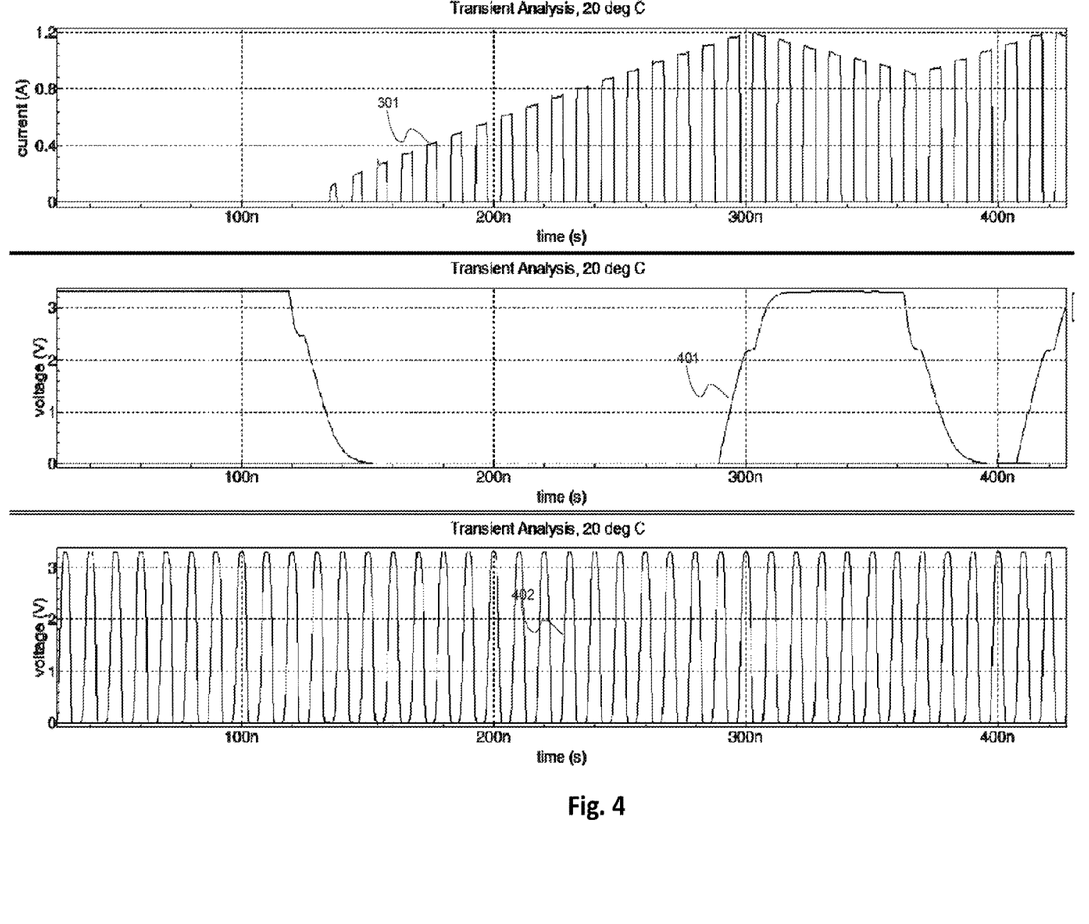
FIG. 4 shows the simulated current through the laser, and the signals that drive the switches M1 and M3.

FIG. 4 shows the simulated current through the laser, and the signals that drive the switches M1 and M3. The figure shows a zoom-in, in time, from 0 to 430 ns. Again current 301 is shown for reference. Here the driving signals drive_P (curve 401) and Pulse1 (curve 402) are shown. The duty cycle of signal 402 is not exactly 50%, which is required to get a 50% duty cycle as current through the laser.

Figure 5:
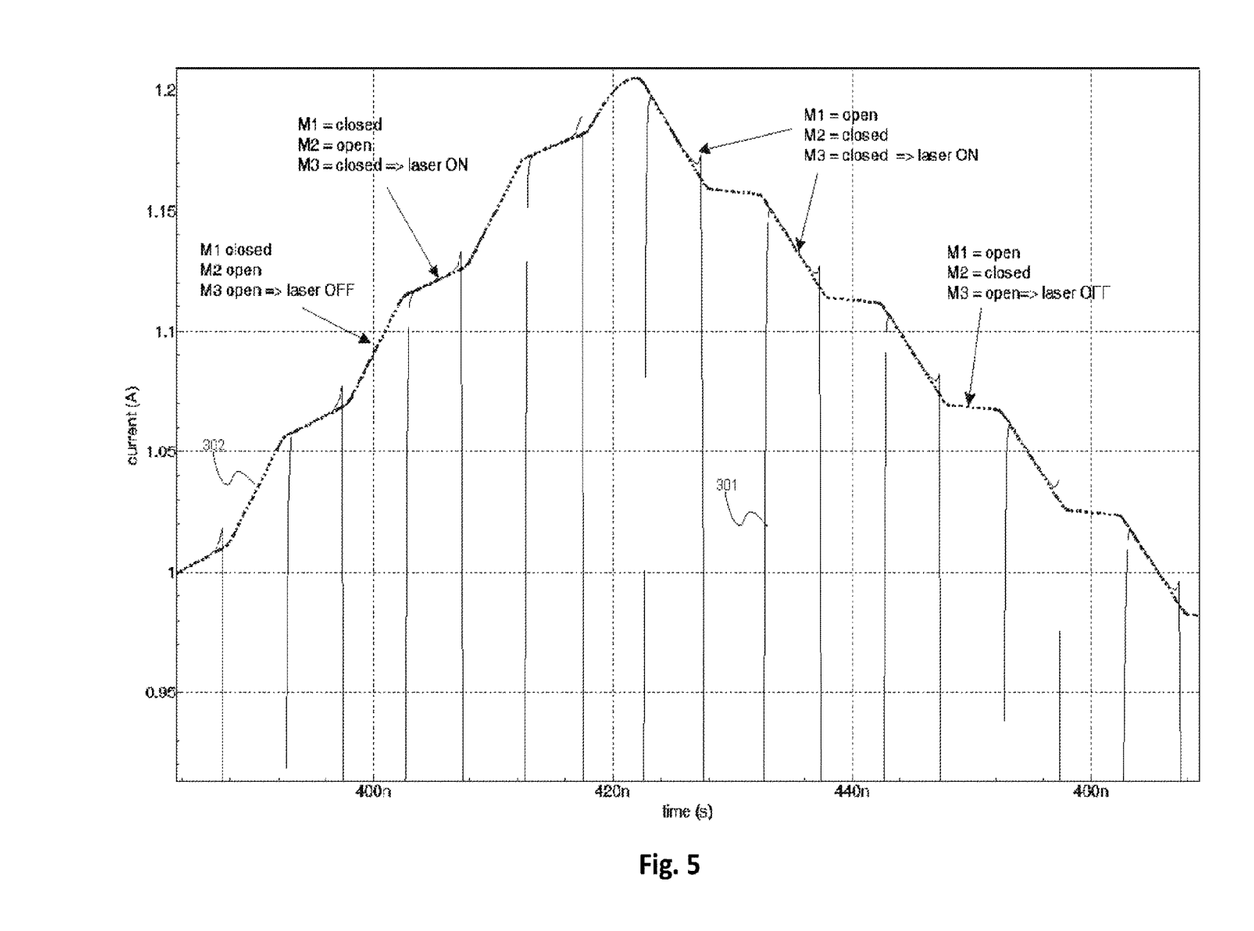
FIG. 5 shows a zoom in of the current through the laser and of the current through the inductor, demonstrating the dual use of the current through the inductor.

FIG. 5 shows a zoom-in of the current through the laser and that through the inductor, demonstrating the dual use of the current through the inductor L1. Curves 301 and 302 get repeated here in overlay with a further zoom-in of the same simulation. When M1 is closed, the current 302 is rising, when M2 is open, the current is decreasing. When M3 is closed, the laser is taking power from the inductor L1, making the increase of the current 302 less steep when M1 is closed, and making the decrease in current steeper when M1 is open.

Figure 6:
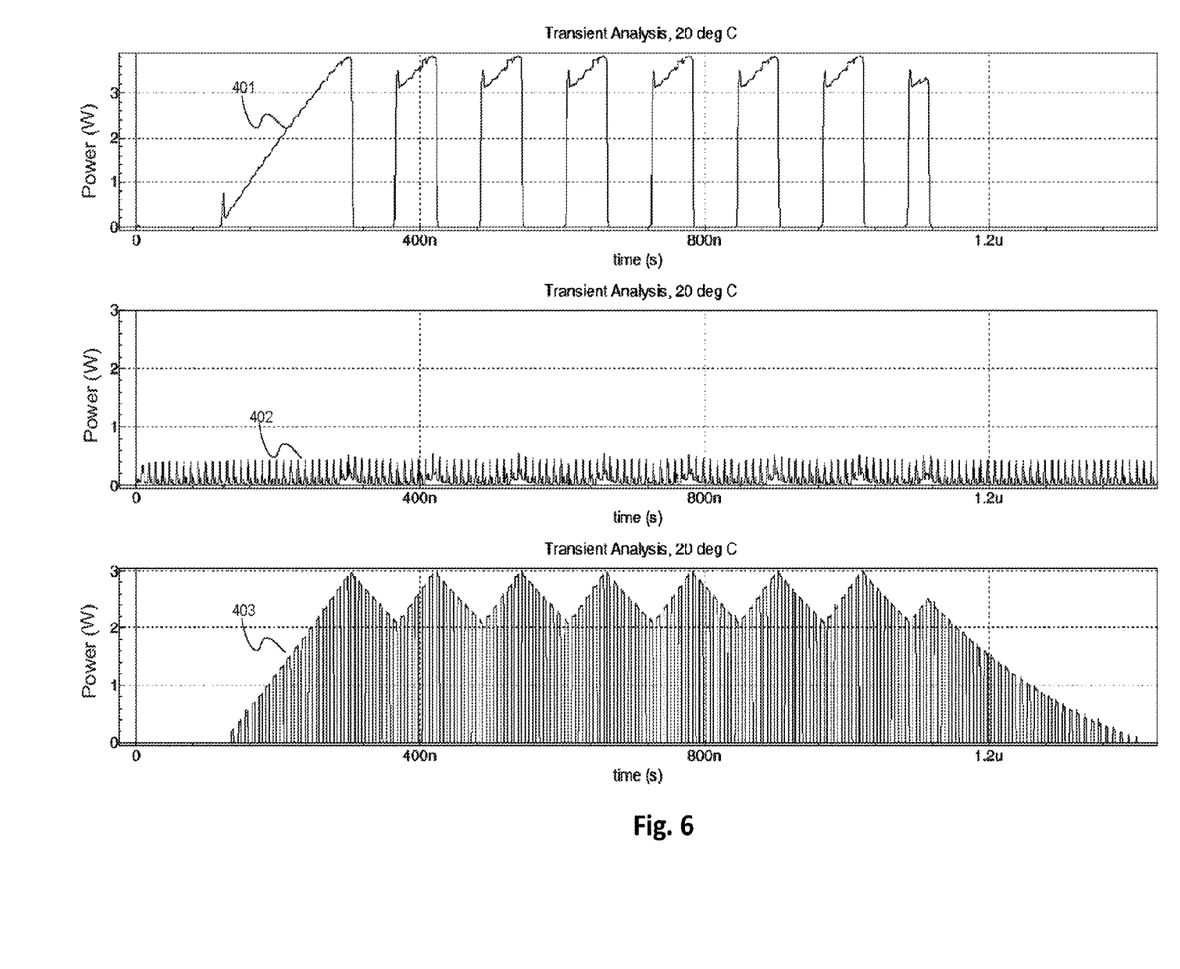
FIG. 6 shows powers versus time of a circuit according to FIG. 2.

FIG. 6 shows powers versus time of a circuit according to FIG. 2. The figure shows the voltages Vlaser and Vref2 in the simulation that are input to the comparator. Curve 401 is the power that is drawn from Vsupply versus time in Watt. Integrated over the total burst period (from 100 ns till 1.4 us) this is 1.696 uJ. The power used by the auxiliary circuits, that includes the comparator, the drive circuits for M1 . . . M4, is given by curve 402, and gives in the same period a power dissipation of 153 nJ. The power used by the laser (voltage time current over the laser) is 1.289 uJ. When calculating herefrom the efficiency from supply sources to laser, a 69.7% efficient conversion is achieved. When considering lower frequency modulation during the burst, or by using adapted CMOS technologies, or by finding a better inductor (e.g. with lower series resistance) it can be expected that even better conversions can be achieved. Overall expectancy of the efficiency of this circuit is in the 60 to 85% range.

The comparator X2 compares the bottom voltages, on nodes Vref2 and Vlaser.

Figure 7:
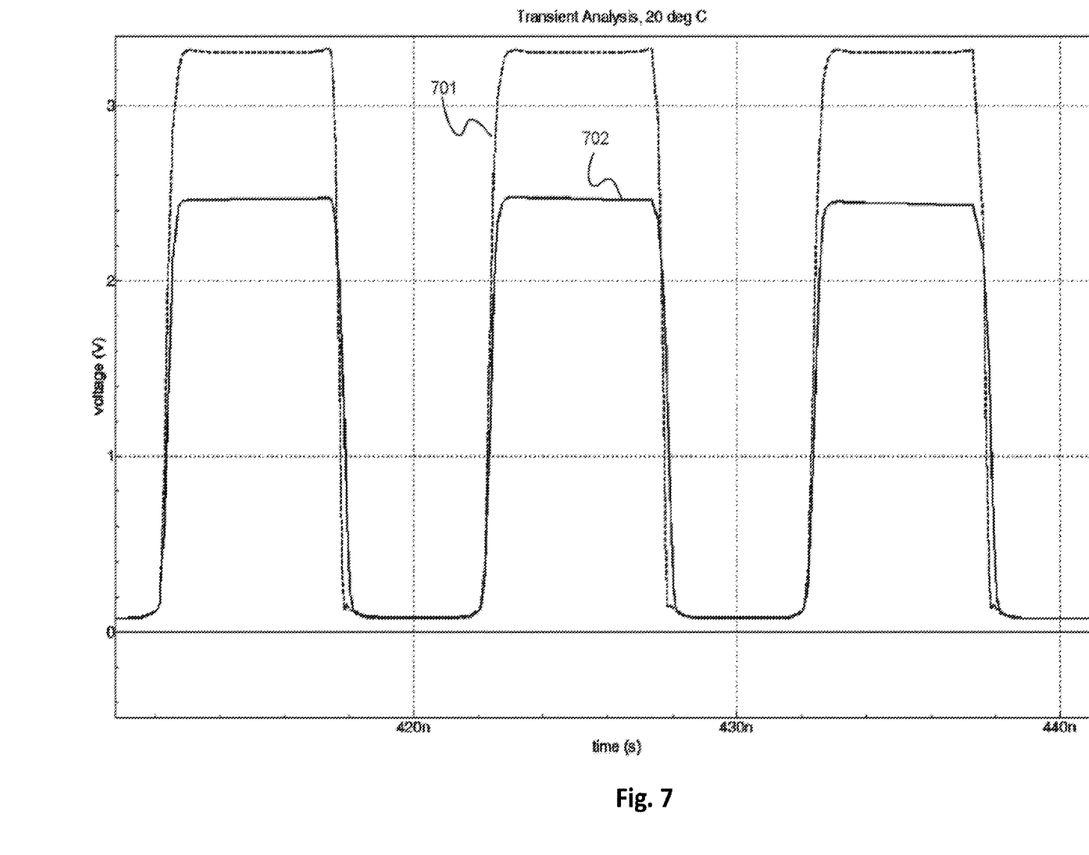
FIG. 7 shows the voltages Vlaser and Vref2 in the simulation that are input to the comparator.

FIG. 7 show curves 701 and 702 that are Vref2 and Vlaser respectively versus time with the current demonstrated simulation.

Figure 8:
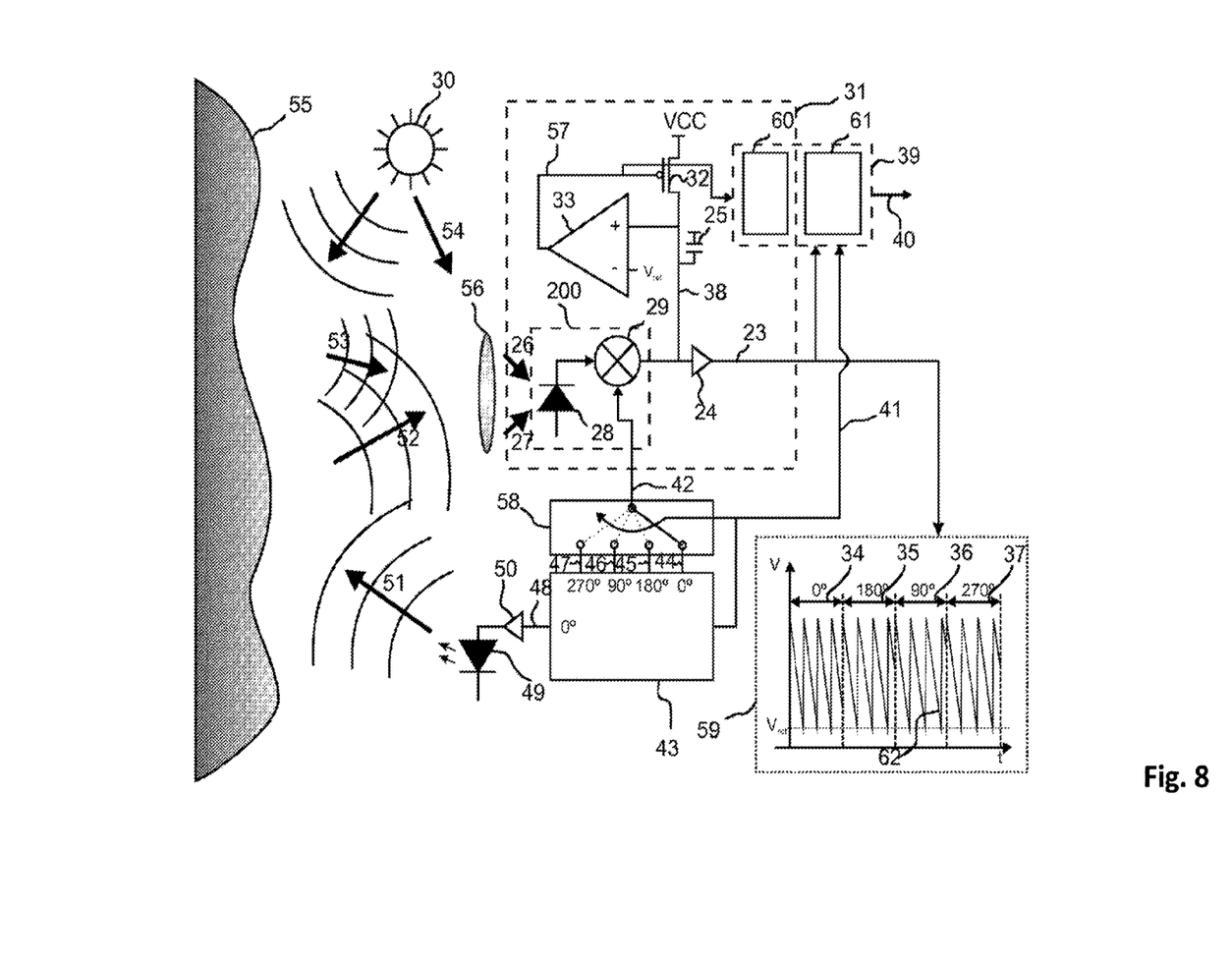
FIG. 8 schematically shows an implementation of a TOF sensor according to an embodiment of the present disclosure.

FIG. 8 shows a first embodiment of a range finding system. The range finding system comprises a light source 49 for emitting light 51 onto a scene 55, preferably focused onto an area of interest, where the light is reflected. The range finding system further comprises at least one pixel 31 for receiving reflected light. In order for the light source 49 to emit modulated light, a signal generator 43 is provided. The signal generator 43 generates a first clock signal or modulation signal on node 48 that is preferably permanently oscillating at a predetermined frequency, e.g. at about 20 MHz for e.g. 1-10 meter distance range measurement, or at about 100 MHz for e.g. 0.1-10 meter distance measurement. This signal generator 43 also generates second to fifth clock signals which are delivered onto nodes 44, 45, 46, 47, respectively, having a 0°, 180°, 90° and 270° phase relation with the first clock signal on node 48. A person skilled in the art can also consider using other or more clock phases in the operation scheme, more clock phases leading towards better measurement precision in exchange for a longer measurement time. Alternatively, instead of modulating by means of phases of a clock signal, a person skilled in the art can also consider transmitting a pseudo-random bit stream and mixing with a set of delayed and/or inverted same pseudo random bit streams. The use of pseudo-random bit streams, sometimes referred to as pseudo-noise is known in literature by a person skilled in the art. In that case, instead of the first and second clock signals it is advised to use a pseudo-random pattern, instead of the third clock signal use the same pseudo-random pattern but bitwise inverted and instead of the fourth clock signal, the same pseudo random pattern but delayed by a bit period and instead of the fifth clock signal, the same pseudo-random pattern but inverted and delayed by a bit period.

The signal generator 43 also generates a control signal 41 that is determining for a modulation signal alteration means to change the modulation signal, e.g. a control signal 41 that is determining for a selector 58 to select between the second to fifth clock signals, i.e. between the different phases of the clock signal. Selector 58 is switching sequentially between these four phases connecting the input node 42 of a mixer 29 of a detector and mixer stage 200 with the second to fifth clock signals on nodes 44, 45, 46 and 47 sequentially. At each of these positions selector 58 can stay connected for a relaxation period of e.g. about 1 ms.

Drive circuitry 50 drives the light source 49 that emits its light 51 onto the scene 55, preferably focused on the area of interest. Part of this light will be reflected, thus generating reflected light 52. This reflected light 52 then arrives on an optical focusing system such as a lens 56, through which it is imaged or focused on a detector 28 inside pixel 31, where the incident fraction is called the reflected modulated light (ML) 27.

Indirect light 53 and direct light 54, both originating from secondary light sources 30 not intended for the TOF measurement, will also be present in the scene, impinge on the optical focusing system 56 and thus focused on the detector 28. The part of this light entering detector 28 will be called background light (BL) 26. Light sources 30 generating BL include incandescent lamps, TL-lamps, sunlight, daylight, or whatever other light that is present on the scene and does not emanate from the light source 49 for TOF measurement. An aim of the present disclosure is to obtain valid TOF measurements even in the presence of the signal from BL 26.

ML 27 and BL 26 impinge onto the photodetector 28, and generate, respectively, an ML-current and a BL-current, which are photo-induced current responses to the impinging BL 26 and ML 27. Detector 28 outputs these currents to a subsequent mixing means, e.g. mixer 29, for mixing the current responses to the impinging BL 26 and ML 27 with the phase-shifted clock signal on input node 42. As already stated earlier, this BL 26 can induce a BL-current of up to 6 orders of magnitude higher than the ML-current induced by the ML 27 received for TOF measurements.

Detector 28 and mixer 29, forming detector and mixer stage 200, can as well be implemented as one single device, for example as described in EP1513202A1, where the photo-generated charges are mixed generating the mixing product current at once.

The detector and mixer stage 200 will generate the mixing products of the current responses to the impinging BL 26 and ML 27 with phase-shifted clock signals, and these signals are being integrated on node 38 by means of an integrator, for example implemented with a capacitor 25, which preferably is kept small, e.g. the parasitic capacitance of the surrounding transistors. During integration, an automatic reset of the mixer output signal on the integrator node 38 is performed.

This may for example be implemented by a comparator 33 triggering a reset switch, e.g. reset transistor 32, so that the mixer output signal on node 38 is automatically reset whenever it reaches a reference value Vref, thus avoiding saturation.

In alternative embodiments, not illustrated in the drawings, the automatic reset of the mixer output signal on the integrator node 38 can be implemented in several other ways. One of them is triggering a charge pump, instead of the reset switch 32, to add a fixed amount of charges to capacitor 25 yielding a better noise performance at the cost of some more complexity.

The mixing products forming the mixer output signal are available in a sequential form synchronized with the modulation signal alteration means, in the example illustrated selector 58, at integrator node 38. An output driver 24, e.g. a buffer, provides a voltage gain substantially 1 and current amplification so as to provide a stronger output signal at output node 23.

In graph 59 an example of an output signal at node 23 is represented. Curve 62 corresponds to the voltage evolution versus time of the output signal at output node 23. It is supposed that the average BL contribution 26 and average ML 27 is constant during acquisition.

During a first relaxation period 34, selector 58 is connected to node 44. The mixing of the incoming signal from the detector 28 (responses to BL 26 and ML 27) is done with the second clock signal at node 44, which is a 0° shifted version of the first clock signal driving the light source 49. The mixer output signal at node 38 will thus be determined by a BL component and a 0° mixed ML output. The next relaxation period 35 starts by connection of input node 42 to node 45 through selector 58. From then on, the mixer 29 is driven 180° out of phase. Therefore, its output will be determined by the same BL component and a 180° mixed output. The phases 90° and 270° are subsequently treated similarly in subsequent relaxation periods 36 and 37, respectively.

Time-of-flight data reconstruction block 39 uses the output signal at output node 23 to measure, e.g. by taking samples, the end values of each relaxation period 34, 35, 36, 37, also called phase interval. This data is grouped to TOF pairs, e.g. (0°, 180°) and (90°, 270°). TOF data reconstruction block 39 serves to translate the bare pixel signals to useful time-of-flight output 40.

Figure 9:
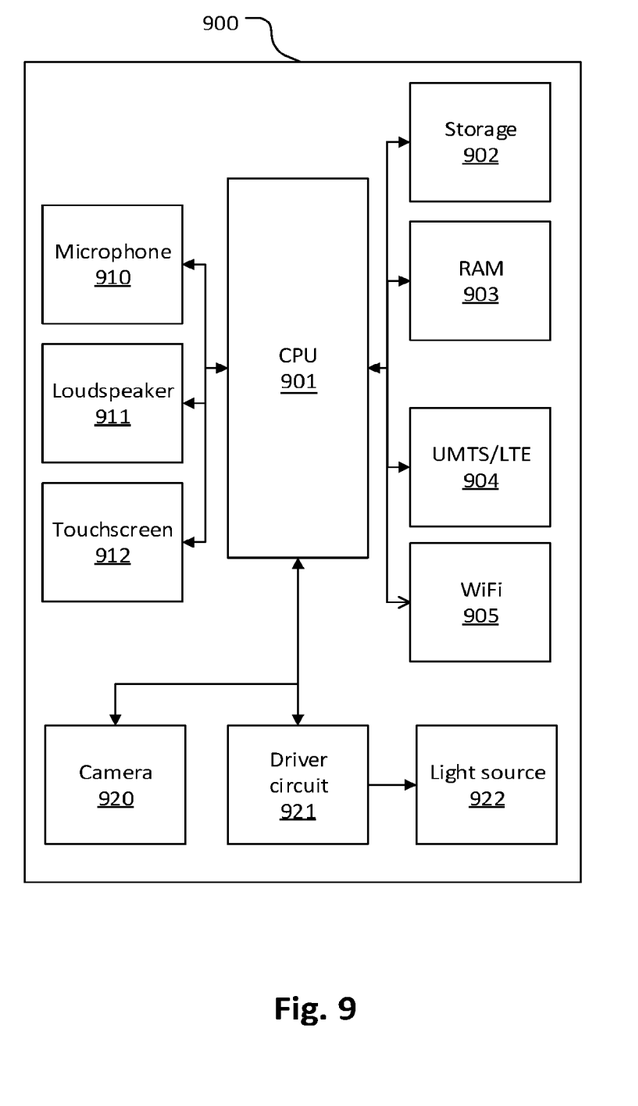
FIG. 9 schematically describes in more detail an embodiment of an electronic device that may be used in context of the embodiments.

FIG. 9 schematically describes in more detail an embodiment of an electronic device 900 that may be used in context of the embodiments. The electronic device 900 comprises a CPU 901 as processor. The electronic device 900 further comprises a microphone 910, a loudspeaker 911, and a touchscreen 912 that are connected to the processor 901. These units 910, 911, 912 act as a man-machine interface and enable a dialogue between a user and the electronic device. The electronic device 900 further comprises an interface for a telecommunication (e.g UMTS/LTE interface) 904 and an interface for a wireless LAN (e.g. WiFi-interface) 905. These units 904, 905 act as I/O interfaces for data communication with external devices such as companion devices, servers, or cloud platforms. The electronic device 900 further comprises an image sensor 920 that is arranged to obtain compressed sensing image data. Image sensor 920 may in particular relate to a Time-of-Flight camera technique. The electronic device 900 further comprises a driver circuitry 921 to drive a light source 922, e.g. for distance range-finding with at least one predetermined pulse frequency. The electronic device 900 further comprises a data storage 902 (e.g. a Hard Drive, Solid State Drive, or SD card) and a data memory 903 (e.g. a RAM). The data memory 903 is arranged to temporarily store or cache data or computer instructions for processing by processor 901. The data storage 902 is arranged as a long term storage, e.g. for recording image sensor data obtained from the image sensor 920.

It should be noted that the description above is only an example configuration. Alternative configurations may be implemented with additional or other sensors, storage devices, interfaces or the like. For example, in alternative embodiments, UMTS/LTE interface 904, WiFi interface 905, microphone 910, touchscreen 912, and/or loudspeaker 911 may be omitted or replaced by other units. Likewise, touchscreen 912 may for example be replaced by a display device that is not touch sensitive.

Note that the present technology can also be configured as described below.

(1) A driver circuitry including an inductor (L1) configured to be used both as inductor of a buck convertor, and to provide high-speed pulse driving of the load.
(2) The driver circuitry of (1), wherein the inductor is a single inductor conversion circuit.
(3) The driver circuitry of (1) or (2), wherein a current in the load is supplied by the single inductor (L1).
(4) The driver circuitry of anyone of (1) to (3), wherein the driver circuitry is arranged to work for a power supply with a voltage range that has an overlap with the voltage over a load voltage range in its ON-state.
(5) The driver circuitry of anyone of (1) to (4), wherein the driver circuitry includes a buck convertor that includes a first switch (M1), a second switch (M2), and a diode (D1) for switched operation, and a comparator (X1) that is configured to drive the first switch (M1) and the second switch (M2).
(6) The driver circuitry of anyone of (1) to (5), wherein the driver circuitry includes two separately driven switches (M1, M2) with non-overlapping signals.
(7) The driver circuitry of anyone of (1) to (6), further including a driving switch (M3) to which an input is applied that is the inverse of a target light pattern output.
(8) The driver circuitry of anyone of (1) to (7), further including two driving switches (M3, M4) configured to be driven by the same signal (pulse1).
(9) The driver circuitry of anyone of (1) to (8), further including a comparator (X1) configured to compare a voltage (Vsense) that is indicative for the current in the inductor (L1) with a reference voltage (Vref).
(10) The driver circuitry of anyone of (1) to (9), further including a sensing resistor (R1) configured to measure the current in the inductor (L1).
(11) The driver circuitry of anyone of (1) to (10), further including a charging capacitor (C1) configured to function as a charge tank.
(12) The driver circuitry of anyone of (1) to (11), wherein the load is a light source, e.g. a light-emitting diode (LED), an organic light-emitting diode (OLED), or a laser or a laser diode.
(13) The driver circuitry of anyone of (1) to (12), wherein the driver circuitry is configured to be used to drive a light source for distance range-finding with at least one predetermined pulse frequency of several MHz such as of 100 MHz or substantially 100 MHz.
(14) The driver circuitry of (1) to (13), wherein the driver circuitry is configured to be used to drive a light source for distance range-finding with at least one predetermined pulse frequency of e.g. 100 MHz or substantially 100 MHz.
(15) Electronic device including;
a load and;
a driver circuitry including an inductor configured to be used both as inductor of a buck convertor, and to provide high-speed pulse driving of the load.
(16) The electronic device of (15), wherein the load is a light source.
(17) The electronic device of (15) or (16), wherein the driver circuitry is configured to be used to drive a light source for distance range-finding with at least one predetermined pulse frequency.
(18) The electronic device of anyone of (15) to (17), wherein the electronic device is a computer system, a laptop, a tablet, a smartphone, a virtual or augmented reality head's up display system, a smartwatch, a photo camera, a video camera or a drone.

The present application claims priority to European Patent Application 16175206.8 filed by the European Patent Office on 20 Jun. 2016, the entire contents of which being incorporated herein by reference.

The invention claimed is:
1. A driver circuitry, comprising:
a buck convertor that includes a first switch, a second switch, and a diode for switched operation, and a comparator configured to drive the first switch and the second switch;

an inductor connected between the first switch and the second switch of the buck convertor and a load, wherein the inductor supplies a current to the load;
a third switch that short-circuits the load; and
a fourth switch, wherein
the third switch and the fourth switch are driven by a same signal.

2. The driver circuitry of claim 1, wherein the driver circuitry works for a power supply with a voltage range that has an overlap with the voltage over a load voltage range in its ON-state.

3. The driver circuitry of claim 1, wherein the first switch and the second switch are of the buck convertor driven by non-overlapping signals.

4. The driver circuitry of claim 1, further comprising:
a driving switch to which an input is applied that is the inverse of a target light pattern output.

5. The driver circuitry of claim 1, wherein the first switch and the second switch of the buck convertor are driven by the same signal.

6. The driver circuitry of claim 1, wherein the comparator is configured to compare a voltage that is indicative for the current in the inductor with a reference voltage.

7. The driver circuitry of claim 1, further comprising:
a sensing resistor configured to measure the current in the inductor.

8. The driver circuitry of claim 1, further comprising:
a charging capacitor configured to function as a charge tank.

9. The driver circuitry of claim 1, wherein the load is a light source.

10. The driver circuitry of claim 1, wherein the driver circuitry is configured to drive a light source for distance range-finding with at least one predetermined pulse frequency.

11. An electronic device, comprising:
a load;
a buck convertor that includes a first switch, a second switch, and a diode for switched operation, and a comparator configured to drive the first switch and the second switch;
an inductor connected between the first switch and the second switch of the buck convertor and a load, wherein the inductor supplies a current to the load;
a third switch that short-circuits the load; and
a fourth switch, wherein
the third switch and the fourth switch are driven by a same signal.

12. The electronic device of claim 11, wherein the load is a light source.

13. The electronic device of claim 11, wherein the electronic device is configured to drive a light source for distance range-finding with at least one predetermined pulse frequency.

14. The electronic device of claim 11, wherein the electronic device is a computer system, a laptop, a tablet, a smartphone, a virtual or augmented reality head's up display system, a smartwatch, a photo camera, a video camera or a drone.

* * * * *